United States Patent Office 3,578,507
Patented May 11, 1971

3,578,507

METHOD OF PRODUCING NON-OPAQUE P-TYPE WIDE BAND GAP SEMICONDUCTOR MATERIALS

Kang-rong Chiang, Chicago, Zoltan K. Kun, Skokie, and Robert J. Robinson, Park Ridge, Ill., assignors to Zenith Radio Corporation, Chicago, Ill.

No Drawing. Filed Apr. 28, 1969, Ser. No. 819,962
Int. Cl. H01l 7/62
U.S. Cl. 148—1.5 10 Claims

ABSTRACT OF THE DISCLOSURE

To produce a non-opaque p-conductivity type wide band gap semiconductor material, a crystalline semiconductor material comprising a zinc chalcogenide is simultaneously doped with zinc atoms and with atoms of a Group V element in non-stoichiometric proportions, with an excess of the Group V atoms. Preferably, the starting material is a hybrid crystalline semiconductor material comprising II–VI compound and III–V compound constituents. P-type conductivity with specific resistivities of 1.0 ohm centimeter or less without opaque darkening is obtained with this process.

BACKGROUND OF THE INVENTION

This invention relates to the production of wide band gap p-type semiconductor crystalline materials and more particularly to the production of such materials having an energy band gap in the visible light or shorter wavelength spectrum.

Semiconductor diode light sources operating in both spontaneous emission or stimulated emission modes are known in the art, but such known devices have operated only at low efficiencies and longer wavelengths. To provide the visible light emission at higher efficiencies and at short wavelengths, wide band gaps and higher radiative efficiency materials are required. Certain II–VI compounds, in particular most of the zinc and cadmium chalcogenides, have the requisite wide band gaps but have not been amenable to shallow acceptor doping and it has therefore not been feasible to produce useful, if any, PN junctions in such II–VI materials.

With the exception of zinc telluride, which occurs as a p-type semiconductor naturally and is not amenable to high conductivity n-type doping, and cadmium telluride which can be doped either n- or p-type but has too narrow a band gap for visible emission, the binary II–IV compound semiconductor materials tend to be naturally-n-type (or in the case of zinc sulfide high resistivity) and are not susceptible to high conductivity p-type doping by conventional methods. It has been reported that mixed crystals of zinc selenide and zinc telluride in approximately equal proportions may be doped either n-type or p-type as desired by the use of conventional dopants and doping methods, but carrier concentrations are apparently limited to the order of $10^{14}$ or $10^{15}$ carriers per cubic centimeter at room temperature for p-doped materials, and the band gap is not sufficiently wide to permit radiative transitions at the short or intermediate visible wavelengths. Even more recently than the present invention, successful p-type doping of cadmium sulfide by ion implantation of bismuth atoms has been reported, but such ion implantation is apt to produce undesirable lattice distortions, and again the room temperature conductivities obtained have been much lower than desired. Prior attempts to produce stable p-type wide band gap zinc chalcogenides, particularly zinc sulfide, zinc selenide or zinc sulfoselenide, with sufficient acceptor concentrations have been totally unsuccessful.

In the copending application of Robert J. Robinson, Ser. No. 661,866, filed Aug. 21, 1967 for Solid State Light Sources and assigned to the present assignee, there are disclosed and claimed a new class of hybrid materials exhibiting the wide energy band gaps characteristic of the II–VI compounds and producible with either n-type or p-type conductivity. These hybrids are composed of binary, ternary or quaternary alloys or solid solutions of one or more II–VI compounds with at least one compound semiconductor comprising Group III atoms in a trivalent state. In the preferred materials, the solid solutions are composed of one or more II–VI compounds and one or more III–V compounds. As taught in the Robinson application, such hybrid materials may be doped to p-type conductivity by substitution of Group II atoms for Group III atoms in the lattice structure of the solid solution. The Robinson application describes production of the hybrid materials by precipitation from the liquid phase at high temperatures, by halide transport vapor deposition in a closed capsule, or by epitaxial crystal growth processes. The hybrid materials may then be doped to p-type conductivity by diffusing evaporated zinc or cadmium in a closed capsule.

In the copending application of Zoltan K. Kun for Method of Producing P-Type Wide Band Gap Semiconductor Materials filed concurrently herewith and assigned to the present assignee, there is disclosed and claimed a novel method of producing wide band gap p-type semiconductor crystalline materials which comprises evaporating a III–V compound semiconductor conditioner layer onto a crystalline non-p-type II–VI compound semiconductor host substrate, diffusing the conditioner layer into the substrate to convert at least a portion of it to a II–VI/III–V hybrid crystalline material of the type described and claimed in the above-identified Robinson application, and doping the hybrid material to p-type conductivity by infusion of Group II atoms in its lattice. In the specific embodiments of this process evolved by Kun, p-type conductivity with specific resistivities in the range from 1 to 100 ohm-centimeters is obtained, but the conversion to p-conductivity may be accompanied by opaque darkening of the crystalline material which impairs the ability of the material to emit or transmit photons.

It is a principal object of the present invention to provide a method of producing a non-opaque p-type semiconductor crystalline material having an energy band gap in the visible light or shorter wavelength spectrum.

In accordance with the invention, a method of producing a non-opaque p-type semiconductor crystalline material having an energy band gap in the visible light or shorter wavelength spectrum comprises doping a crystalline semiconductor material comprising a zinc chalcogenide simultaneously with zinc atoms and with atoms of a Group V element in non-stoichiometric proportions with an excess of the Group V atoms.

In accordance with another aspect of the invention, a method of producing non-opaque p-type semiconductor crystalline material having an energy band gap in the visible light or shorter wavelength spectrum comprises doping a II–VI/III–V hybrid crystalline semiconductor material simultaneously with atoms of a Group II constituent of the starting material and atoms of a Group V element in non-stoichiometric proportions with an excess of the Group V atoms. Preferably, the II–IV compound component of the hybride lattice is zinc sulfide, zinc sulfoselenide or zinc selenide, the Group II dopant is zinc, and the Group V dopant is phosphorous or arsenic.

The features of the present invention which are believed to be novel are set forth with particularity in the appended claims. The invention, as well as further objects and advantages thereof, may best be understood by reference to the following description.

More specifically, the process of the present invention in its preferred application involves simultaneous double doping of a non-p-type II–VI semiconductor material or a non-p-type hybrid II–VI/III–V semiconductor material of the type described and claimed in the above-identified Robinson application. Preferably, the starting material comprises a zinc chalcogenide, more specifically zinc sulfide, zinc selenide or zinc sulfoselenide; the zinc sulfide/gallium phosphide and zinc selenide/indium arsenide hybrid materials are among the most readily amenable to treatment in accordance with the process of the present invention. The best experimental results to date have been obtained with a zinc sulfide/gallium phosphide hybrid material grown in a minimal-free-volume capsule from a gallium melt.

The mechanism by which p-type conductivity is obtained is not fully understood, but there is strong experimental evidence that there is at least some substitutional doping by substitution of the zinc dopant atoms for the Group III constituent of the starting material. Zinc may also be infused interstitially. Similarly, the Group V dopant may be infused interstitially as well as in substitution for the anion of the II–VI constituent of the starting material. In order to achieve the objective of the present invention, namely high-p-type conductivity without darkening or opacification of the crystalline material, the Group V dopant must be present in greater than stoichiometric proportion to the Group II dopant. Thus, if the dopants used are zinc and phosphorous, as preferred with starting materials based on zinc sulfide or zinc sulfoselenide, the phosphorous must be present in an amount greater than its stoichiometric proportion to zinc in the compound zinc phosphide $Zn_3P_2$. For starting materials comprising zinc selenide rather than zinc sulfide, such as zinc selenide infused with elemental indium, the preferred Group V dopant is arsenic which must be present in an amount greater than its stoichiometric proportion to zinc in the compound zinc arsenide $Zn_3As_2$.

In a preferred embodiment of the invention, a transparent p-type material with 0.5 ohm-centimeter resistivity was produced by growing a zinc sulfide/gallium phosphide hybrid material from a gallium melt. This was accomplished by using a premixed powder containing 60 weight percent gallium phosphide and 40 weight percent zinc sulfide. The resulting mixed crystal or hybrid zinc sulfide/gallium phosphide material was treated at 900° C. for one hour with 5.8 milligrams of zinc and 6.5 milligrams of phosphorous in a quartz capsule.

In another illustrative process, a mixed crystal composed of zinc selenide infused with indium at 750° C. for 20 minutes and then quenched in water was treated with 3 milligrams of zinc and 3.3 milligrams of arsenic for ½ hour at 750° C. This processing yielded non-opaque p-type material with about 10 to 20 ohm-centimeters resistivity.

More complex materials such as zinc sulfoselenide/gallium phosphide may also be rendered p-type by the process of the present invention. For example, a zinc sulfoselenide material formed from 35 weight percent ZnS and 65 weight percent ZnSe, heated in a closed capsule with a ZnS/GaP hybrid material grown from a gallium melt, forms a thin surface film of ZnS/ZnSe/GaP which may be rendered p-type with high conductivity by simultaneous doping with zinc and phosphorous in non-stoichiometric proportions with an excess of phosphorous.

Thus the invention provides a simple method of obtaining high-conductivity p-type wide band gap semiconductors. Hybrid materials comprising a zinc chalcogenide and a Group III element, preferably as a component of a III–V compound constituent, are used as starting materials, and in each instance simultaneous doping with zinc and either phosphorous or arsenic (the choice being dependent on the composition of the starting material), with the phosphorous or arsenic being present in greater than stoichiometric proportions with respect to the zinc, is the preferred treatment. Complete transparency may not always be obtained, and there may be some slight shift in the body color of the base material upon conversion to p-type conductivity, but the opaque darkening characteristic of prior processes and heretofore considered unavoidable in rendering wide band gap semiconductor materials p-type, have clearly been avoided.

While a particular embodiment of the present invention has been shown and described, it will be obvious to those skilled in the art that changes and modifications may be made without departing from the invention in its broader aspects, and, therefore, the aim in the appended claims is to cover all such changes and modifications as may fall within the true spirit and scope of the invention.

We claim:

1. The method of producing a non-opaque p-type semiconductor crystalline material having an energy band gap in the visible light or shorter wavelength spectrum, which method comprises doping a II–VI/III–V hybrid crystalline semiconductor material simultaneously with atoms of the Group II constituent of said material and atoms of a Group V element in non-stoichiometric proportions with an excess of the Group V atoms.

2. The method of producing a non-opaque p-type semiconductor crystalline material having an energy band gap in the visible light or shorter wavelength spectrum, which method comprises doping a hybrid crystalline semiconductor material comprising a solid solution of a zinc chalcogenide and a III–V compound semiconductor simultaneously with zinc atoms and with atoms of a Group V element in non-stoichiometric proportions with an excess of Group V atoms.

3. The method according to claim 2, in which the hybrid material is a zinc sulfide/gallium phosphide solid solution, and in which the Group V dopant atoms are phosphorous.

4. The method according to claim 2, in which the hybrid crystalline material comprises zinc selenide infused with indium and in which said Group V dopant atoms are arsenic.

5. The method according to claim 2, in which the hybrid crystalline material is zinc sulfoselenide/gallium phosphide and in which said Group V dopant atoms are phosphorous.

6. The method of producing a non-opaque p-type semiconductor crystalline material having an energy band gap in the visible light or shorter wavelength spectrum, which method comprises doping a hybrid crystalline semiconductor material comprising a solid solution of zinc sulfide or zinc sulfoselenide and gallium phosphide with zinc and with phosphorous in non-stoichiometric proportions with an excess of the phosphorous dopant.

7. The method of producing a non-opaque p-type semiconductor crystalline material having an energy band gap in the visible light or shorter wavelength spectrum, which method comprises doping a crystalline semiconductor material comprising a zinc chalcogenide simultaneously with zinc atoms and phosphorous atoms in non-stoichiometric proportions with an excess of phosphorous.

8. The method according to claim 7 in which the semiconductor starting material comprises gallium phosphide in solid solution with said zinc chalcogenide.

9. The method according to claim 8, in which said zinc chalcogenide is zinc sulfide or zinc sulfoselenide.

10. The method according to claim 9, in which said zinc chalcogenide is zinc sulfide and said starting material is grown from a gallium melt.

References Cited

UNITED STATES PATENTS

| | | | |
|---|---|---|---|
| 2,822,310 | 2/1958 | Stieltjes et al. | 148—189 |
| 2,846,340 | 8/1958 | Jenny | 148—189 |

L. DEWAYNE RUTLEDGE, Primary Examiner

R. A. LESTER, Assistant Examiner

U.S. Cl. X.R.

148—171, 186, 189; 252—62.3; 317—237